(12) United States Patent
Dahl

(10) Patent No.: US 10,324,481 B2
(45) Date of Patent: Jun. 18, 2019

(54) VOLTAGE REGULATORS

(71) Applicant: Nordic Semiconductor ASA, Trondheim (NO)

(72) Inventor: Hans Ola Dahl, Trondheim (NO)

(73) Assignee: Nordic Semiconductor ASA, Trondheim (NO)

(*) Notice: Subject to any disclaimer, the term of this patent is extended or adjusted under 35 U.S.C. 154(b) by 7 days.

(21) Appl. No.: 15/736,765

(22) PCT Filed: Jun. 16, 2016

(86) PCT No.: PCT/GB2016/051789
§ 371 (c)(1),
(2) Date: Dec. 14, 2017

(87) PCT Pub. No.: WO2016/203236
PCT Pub. Date: Dec. 22, 2016

(65) Prior Publication Data
US 2018/0173261 A1    Jun. 21, 2018

(30) Foreign Application Priority Data
Jun. 16, 2015 (GB) .................................. 1510600.8

(51) Int. Cl.
*G05F 1/575* (2006.01)
*G05F 1/46* (2006.01)
(Continued)

(52) U.S. Cl.
CPC .............. *G05F 1/575* (2013.01); *G05F 1/468* (2013.01); *G05F 1/565* (2013.01); *G05F 3/262* (2013.01);
(Continued)

(58) Field of Classification Search
CPC .......... G05F 1/575; G05F 3/262; G05F 1/468; G05F 1/565; H03F 3/45179; H03F 3/345; H03F 2203/45
(Continued)

(56) References Cited

U.S. PATENT DOCUMENTS 6,333,623 B1 * 12/2001 Heisley .................... G05F 1/575
                                                    323/224
6,377,085 B1 *  4/2002 Giuroiu ............... H03F 3/45183
                                                    327/563
(Continued)

FOREIGN PATENT DOCUMENTS

CN         104460802 A       4/2016
DE         101 32 802 A1    11/2002

OTHER PUBLICATIONS

Received STIC search report from EIC 2800 searcher John DiGeronimo dated May 14, 2018.*
(Continued)

*Primary Examiner* — Nguyen Tran
*Assistant Examiner* — Htet Z Kyaw
(74) *Attorney, Agent, or Firm* — Klarquist Sparkman, LLP

(57) ABSTRACT

A low-dropout voltage regulator (2) comprises: a differential amplifier portion (4) including a first amplifier input connected to a reference voltage (16), a second amplifier input, and a differential output which is determined by a difference between the reference voltage and a voltage on the second amplifier input; an output portion (10) arranged to provide a regulator output voltage (62) which is controlled by the differential output of the amplifier portion, the second amplifier input being connected to or derived from (70) the regulator output voltage; and a biasing portion (8) arranged to measure an external load current and to provide a biasing (Continued)

current to the differential amplifier portion which depends on the load current.

17 Claims, 2 Drawing Sheets

(51) Int. Cl.
G05F 1/565 (2006.01)
G05F 3/26 (2006.01)
H03F 3/345 (2006.01)
H03F 3/45 (2006.01)

(52) U.S. Cl.
CPC ......... *H03F 3/345* (2013.01); *H03F 3/45179* (2013.01); *H03F 2203/45* (2013.01)

(58) Field of Classification Search
USPC .......................................................... 323/280
See application file for complete search history.

(56) References Cited

U.S. PATENT DOCUMENTS

| | | | |
|---|---|---|---|
| 6,545,540 B1 | 4/2003 | Enriquez | |
| 6,977,491 B1* | 12/2005 | Caldwell | G05F 1/573 323/282 |
| 7,843,180 B1 | 11/2010 | Cilingiroglu | |
| 8,289,009 B1 | 10/2012 | Strik et al. | |
| 2002/0171403 A1* | 11/2002 | Lopata | H03F 3/45183 323/280 |
| 2003/0011694 A1* | 1/2003 | Dierickx | H04N 5/37452 348/308 |
| 2007/0096702 A1 | 5/2007 | Rasmus | |
| 2008/0272657 A1* | 11/2008 | Hull | G11C 5/147 307/113 |
| 2011/0068758 A1 | 3/2011 | Chiu | |
| 2011/0121802 A1* | 5/2011 | Zhu | G05F 1/575 323/281 |
| 2011/0304362 A1 | 12/2011 | Matsubara | |
| 2014/0084994 A1* | 3/2014 | Merkin | G05F 1/56 327/543 |
| 2014/0117958 A1 | 5/2014 | Price et al. | |
| 2015/0061772 A1* | 3/2015 | Bhattad | G05F 1/56 330/288 |

OTHER PUBLICATIONS

International Search Report and Written Opinion for PCT/GB2016/051789, dated Sep. 8, 2016, 17 pages.
Lam et al., "Adaptively-Biased Capacitor-Less CMOS Low Dropout Regulator with Direct Current Feedback," 2006 Asia and South Pacific Conference on Design Automation, Jan. 2006, pp. 104-105.
Search Report under Section 17(5) for GB1510600.8, dated Jan. 22, 2016, 3 pages.
Zhan et al., "A High-Precision Low-Voltage Low Dropout Regulator for SoC With Adaptive Biasing," 2009 IEEE International Symposium on Circuits and Systems, May 2009, pp. 2521-2524.

* cited by examiner

VOLTAGE REGULATORS

CROSS REFERENCE TO RELATED APPLICATIONS

This is the U.S. National Stage of International Application No. PCT/GB2016/051789, filed Jun. 16, 2016, which was published in English under PCT Article 21(2), which in turn claims the benefit of Great Britain Application No. 1510600.8, filed Jun. 16, 2015.

The present invention relates to voltage regulators, particularly low-dropout voltage regulators.

Low-dropout (or LDO) voltage regulators are linear DC voltage regulators that are capable of operating with very low input-output differential voltages. Such regulators are usually chosen because they have a low minimum operating voltage, high power efficiency and low heat dissipation.

However the Applicant has now appreciated that in typical LDO voltage regulators the high power efficiency is not achieved unless the regulator is operating near to its maximum design load current since the quiescent current it draws is dictated by this maximum load. However the Applicant has further appreciated that in practice in most application the LDO regulator is only required to deliver at or close to its maximum load current for a very small proportion of the time. The actual efficiency achieved in practice is therefore significantly lower than the theoretical value.

The present invention seeks to provide an improved approach and provides a low-dropout voltage regulator comprising:
- a differential amplifier portion including a first amplifier input connected to a reference voltage, a second amplifier input, and a differential output which is determined by a difference between said reference voltage and a voltage on the second amplifier input;
- an output portion arranged to provide a regulator output voltage which is controlled by the differential output of the amplifier portion, said second amplifier input being connected to or derived from said regulator output voltage; and
- a biasing portion arranged to measure an external load current and to provide a biasing current to the differential amplifier portion which depends on said load current.

Thus it will be appreciated by those skilled in the art that in accordance with the present invention there is provided a low-dropout (LDO) voltage regulator that can adapt the level of biasing current that is provided to the differential amplifier based upon the current being drawn by the load. This means that when providing small load currents, the LDO regulator does not require a large quiescent current, significantly reducing the power consumption of the circuit at low loads, while still allowing for the bias current to be "ramped up" in order to maintain stability in the event that a large load current is needed. By adaptively biasing the LDO regulator in this manner, the circuit may also achieve an improved bandwidth and transient response when compared to conventional LDO regulators.

While the present invention is beneficial in a number of applications, the Applicant has appreciated that it is particularly advantageous where an output capacitor is connected across (i.e. in parallel with) the LDO regulator output portion. In a set of such embodiments the output capacitor is provided externally of an integrated circuit device on which the LDO regulator is provided. In conjunction with the load being driven by the LDO regulator, the output capacitor gives the LDO regulator a frequency-dependent transfer function.

As with any circuit, the differential amplifier of an LDO regulator has an associated transfer function which describes the frequency response of the circuit. The transfer function typically has a pole located at a particular frequency known as a corner frequency. Once the frequency of the lowest frequency or "dominant" pole has been reached, the gain of the circuit begins to decrease at a rate of 20 dB/decade (i.e. for every ten-fold increase in frequency, the gain drops by 20 dB). Any subsequent poles will then increase this rate by a further 20 dB/decade. Each pole will also introduce a 90 degree phase shift. Thus with two poles, the output is then in antiphase (i.e. 180 degrees out of phase) with the input, which can cause the circuit to be unstable. Thus in order for a circuit to be stable, the gain should drop to unity at a frequency lower than that of the second pole (i.e. the first "non-dominant" pole).

Since the output capacitor and load form a first order low-pass filter, the corner frequency $f_c$ which corresponds to the dominant pole of the LDO regulator which can be calculated as per Equation 1.

$$f_c = \frac{1}{2\pi RC} \qquad \text{Equation 1}$$

where C is the capacitance of the output capacitor and R is the parallel combination of the resistance of the load, $R_{load}$, and the amplifier's output resistance, $R_{out}$, as per Equation 2 below.

$$R = R_{out} \frac{R_{load}}{(R_{out} + R_{load})} \qquad \text{Equation 2}$$

In such arrangements when the load current is large, the resistance of the load is small, which shifts the frequency of the dominant pole higher. The output resistance of the amplifier is also small when the load current is large and thus does not prevent the dominant pole being shifted to higher frequencies with increasing load current.

This shifting of the dominant pole to higher frequencies may cause stability issues because it does not shift the non-dominant poles, meaning that the second pole could exist at a frequency lower than that at which the gain drops to unity. This is counteracted by having a relatively high bias current for the differential amplifier. However in conventional arrangements this bias current is fixed, meaning the regulator wastes power at low loads providing a high bias when it is not required. In accordance with the invention however the bias current is only increased when necessary, i.e. at higher load currents, making embodiments of the invention more power efficient across a wide range of load currents whilst maintaining stability.

In some embodiments, the biasing portion comprises a biasing resistor and a biasing capacitor. Such embodiments introduce an additional non-dominant pole that responds to the load current. This ensures that when higher load currents are provided and the dominant pole is shifted to a higher frequency, the first non-dominant pole is also shifted to a higher frequency such that unity gain is reached before the second pole.

In a set of embodiments the output portion comprises a first divider transistor having a first impedance and a second divider transistor having a second impedance arranged such that the regulator output voltage is a fraction of a supply voltage, said fraction being determined by a ratio of said first and second impedances, at least one of said first and second impedances being controlled by the differential output of the amplifier portion.

There are a number of differential amplifier configurations known in the art per se that could be readily implemented in accordance with the present invention. However, in a set of embodiments, the differential amplifier portion comprises a long-tailed pair arranged such that the gate terminal of a first differential transistor is connected to the first amplifier input and the gate terminal of a second differential transistor is connected to the second amplifier input, wherein the source terminals of the first and second differential transistors are connected to each other. This arrangement allows for the generation of a differential voltage on an output taken from the drain terminal of one of the differential transistors, wherein the differential voltage depends on a difference between the voltages present on the first and second inputs.

In some embodiments, the source terminals of the first and second differential transistors are connected to a tail transistor. In such embodiments, the tail transistor acts as a current source and may provide the differential amplifier portion with part of the current it requires in order to operate.

In some embodiments, the differential amplifier further comprises a first amplifier current mirror connected to the drain terminal of the first differential transistor and a second amplifier current mirror connected to the drain terminal of the second differential transistor. These current mirrors may act as an active load in order convert the output to a single-ended voltage, mitigating the losses that are common in differential pair amplifiers connected to the supply rail via passive (resistive) loads.

In some embodiments, the differential amplifier comprises a first amplifier current mirror connected to the drain terminal of the first differential transistor, wherein the first amplifier current mirror comprises:
 a first transistor with its source terminal connected to the supply voltage, and its gate and drain terminals connected to the drain terminal of the first differential transistor; and
 a second transistor with its source terminal connected to the supply voltage, and its gate terminal connected to both the drain terminal of the first differential transistor and the gate terminal of the first transistor.

In some embodiments, the differential amplifier comprises a second amplifier current mirror connected to the drain terminal of the second differential transistor, wherein the second amplifier current mirror comprises:
 a third transistor with its source terminal connected to the supply voltage, and its gate and drain terminals connected to the drain terminal of the second differential transistor; and
 a fourth transistor with its source terminal connected to the supply voltage, and its gate terminal connected to both the drain terminal of the second differential transistor and the gate terminal of the third transistor.

In some embodiments, the differential amplifier comprises a third amplifier current mirror including:
 a fifth transistor with its drain terminal connected to the drain terminal of the second transistor, and its source terminal connected to ground; and
 a sixth transistor with its drain terminal connected to the drain terminal of the fourth transistor, and its source terminal connected to ground, wherein the gate terminals of the fifth and sixth transistors are connected to one another. This third current mirror is thus cascaded with the first mirror.

In some embodiments, the first, second, third, and fourth transistors are p-channel metal-oxide-semiconductor field-effect transistors and the fifth and sixth transistors are n-channel metal-oxide-semiconductor field-effect transistors. This advantageous arrangement allows the third current amplifier current mirror to sink a current of equal magnitude to a current sourced by the first current mirror.

As explained above, the biasing portion is arranged in such a way as to provide a biasing current to the differential amplifier portion. While there are a number of ways of achieving this, in a set of embodiments the biasing portion comprises an adaptive biasing transistor arranged to provide a controllable biasing current to the differential amplifier portion. By altering the conductivity of the adaptive biasing transistor, the amount of biasing current provided to the differential amplifier is directly controllable.

While the differential amplifier could be connected directly to the output portion, in a set of embodiments the LDO regulator comprises a buffer portion. The buffer portion may be used to reduce the effective output impedance of the differential amplifier that is seen by the output portion. In a set of embodiments the buffer portion comprises a buffer transistor arranged as a source follower. Preferably the buffer portion acts as a voltage follower, where the output voltage of the buffer portion follows the input voltage applied. The buffer portion advantageously prevents the output portion effectively becoming a mismatched load on the output of the differential amplifier.

The adaptive biasing could be achieved by measuring the current from the output portion directly. However, this could be inefficient given the bias current is typically orders magnitude lower than the output current. In some embodiments the biasing portion comprises a mirror transistor arranged to provide a mirror current. In some embodiments, the mirror transistor is physically smaller than the first divider transistor. The mirror current is then a scaled replica of the output current, e.g. it may be one thousand times smaller than the output current, leading to a significant reduction in power consumption.

An embodiment of the invention will now be described, by way of example only, with reference to the accompanying drawings in which.

Figure 1:
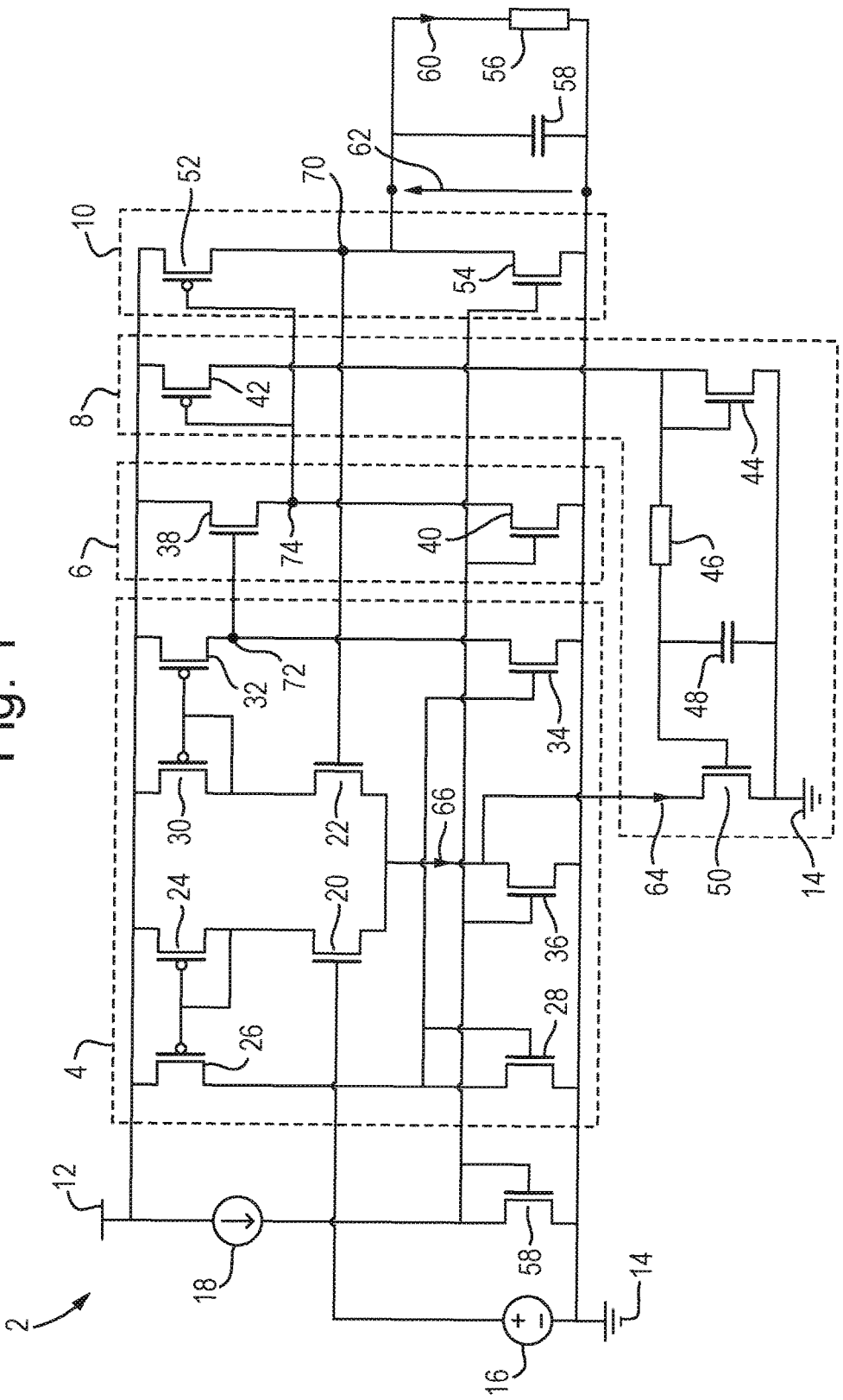
FIG. 1 is a circuit diagram of a low-dropout voltage regulator in accordance with an embodiment of the present invention.

FIG. 1 is a circuit diagram of a low-dropout (LDO) voltage regulator 2 in accordance with an embodiment of the present invention. The LDO regulator 2 comprises an differential amplifier stage 4, buffer stage 6, adaptive biasing stage 8, and output stage 10.

The differential amplifier stage 4 comprises a long-tailed pair arrangement including two n-channel metal-oxide-semiconductor (NMOS) field-effect transistors (FETs or MOSFETs) 20, 22. These two transistors 20, 22 form a differential pair and are arranged so as to produce a differential output that can be passed to the buffer stage 6 as will be explained below.

The gate terminal of the first differential transistor 20 is connected to a reference voltage 16. The gate terminal of the second differential transistor 22 is connected to a node 70 from which the main output voltage 62 from the LDO regulator 2 is taken. This node 70 is the central point of a potential divider within the output stage 10 as will be described later.

The source terminals of the first and second differential transistors 20, 22 are connected to each other. The source terminals of the first and second differential transistors 20, 22 are also connected to an NMOS tail transistor 36. The tail transistor 36 acts as a current source and provides the differential amplifier stage 4 with the minimal amount of current it requires in order to operate. The tail transistor 36 mirrors the current that passes through a current supply transistor 58, which in turn mirrors the current supplied by an external bias current source 18.

Also included within the differential amplifier 4 are first and second current mirrors associated with the respective differential transistors 20, 22. The first such current mirror comprises first and second transistors 24, 26. The first transistor 24 is a p-channel metal-oxide-semiconductor (PMOS) transistor with its source terminal connected to the supply voltage 12 and its gate and drain terminals connected to the drain terminal of the first differential transistor 20. The second transistor 26 is also a PMOS transistor 26 with its source terminal connected to the supply voltage 12 and its gate terminal connected to both the drain terminal of the first differential transistor 20 and the gate terminal of the first transistor 24.

Similarly the second current mirror comprises third and fourth transistors 30, 32. The third, PMOS transistor 30 has its source terminal connected to the supply voltage 12 and its gate and drain terminals connected to the drain terminal of the second differential transistor 22. The fourth, PMOS transistor 32 has its source terminal connected to the supply voltage 12 and its gate terminal connected to both the drain terminal of the second differential transistor 22 and the gate terminal of the third transistor 30.

Fifth and sixth transistors 28, 30 form a third current mirror. The fifth, NMOS transistor 28 has its drain terminal connected to the drain terminal of the second transistor 26 and its source terminal connected to ground 14. The sixth, NMOS transistor 34 has its drain and gate terminals connected to the drain terminal of the fourth transistor 32 and its source terminal connected to ground 14. The gates of the fifth transistor 28 and the sixth transistor 34 are connected to one another. While the first and second current mirrors comprise PMOS transistors that act to source a current, this third current mirror comprises NMOS transistors arranged instead to sink a current. The result of this is that the current through the third current mirror is a "flipped" version of the current through the first current mirror.

These three current mirrors act as an active load in order convert the output provided at node 72 to a single-ended voltage. The voltage present at node 72 depends on the difference between the voltages present on the gate terminals of the first and second differential transistors 20, 22.

The buffer stage 6 comprises a first NMOS buffer transistor 38 and a second NMOS buffer transistor 40. The drain terminal of the first buffer transistor 38 is connected to the supply voltage 12, while the source terminal of the same is connected to the drain terminal of the second buffer transistor 40. The source terminal of the second buffer transistor 40 is connected to ground 14.

The gate terminal of the second buffer transistor 40 is connected to the current supply transistor 58, which in turn mirrors the current supplied by the external bias current source 18 in a similar way to the tail transistor 36.

The gate terminal of the first buffer transistor 38 is connected to the output from the differential amplifier stage 4 via the node 72. The first buffer transistor 38 is arranged as a source follower so the voltage on its source terminal (i.e. the voltage at node 74) follows the voltage on its gate terminal (i.e. the voltage at node 72). This provides a significant reduction in the output impedance when compared to the output impedance of the differential amplifier stage 4.

The output stage 10 comprises a first PMOS divider transistor 52 and a second NMOS divider transistor 54 arranged to provide a regulator output voltage 62 at the node 70 which is a fraction of the supply voltage 12. The fraction depends on the ratio of the impedances of the first and second divider transistors 52, 54, which is controlled by the output voltage from the buffer stage 6 (i.e. the voltage at node 74).

Connected across the output of the output stage 10 are a load 56 and a compensation capacitor 58. The compensation capacitor 58 allows the regulator to respond more quickly to fluctuating loads. Together the load 56 and the compensation capacitor 58 give the LDO regulator 2 a frequency-dependent transfer function. Since the compensation capacitor 58 and load 56 form a first order low-pass filter, the corner frequency $f_c$ which corresponds to the dominant pole of the LDO regulator can be calculated as per Equation 3 below, where $R_{load}$ is the resistance of the load 56, $R_{out}$ is the output impedance of the output stage 8 (i.e. the parallel combination of the impedances of the first and second divider transistors 52, 54) and C is the capacitance of the compensation capacitor 58.

$$f_c = \frac{1}{2\pi R_{out} \frac{R_{load}}{(R_{out} + R_{load})} C} \qquad \text{Equation 3}$$

The adaptive biasing stage 8 includes a PMOS replica transistor 42, which is configured in a common-source arrangement wherein its source terminal is connected to the supply voltage 12. The replica transistor 42 is a physically scaled down version of the first divider transistor 52, and in one particular example is chosen to be one thousand times smaller than the first divider transistor 52. This means that the current through the replica transistor 42 is also a scaled down copy of the current through the first divider transistor 52, which corresponds to the load current 60 through the load 56.

The gate terminal of the replica transistor 42 is connected to the node 74, while its drain terminal is connected to both the drain and gate terminals of an NMOS diode-connected transistor 44. These are connected to a fixed bias resistor 46, which is in turn connected to the gate terminal of an NMOS bias control transistor 50. The bias control transistor 50 is connected in parallel the tail transistor 36 and so has its source terminal connected to ground 14 and its drain terminal connected to both the drain terminal of the tail transistor 36 and the source terminals of the differential transistors 20, 22. This bias control transistor 50 controls a current 64 that flows through it in response to the current flowing through the replica transistor 42.

A bias capacitor 48 is connected to the fixed bias resistor 46 and in parallel with the bias control transistor 50. The bias resistor 46 and capacitor 48 introduce an additional, controllable non-dominant pole into the LDO regulator 2. Since the bias capacitor 48 and resistor 46 form a first order low-pass filter, the corner frequency $f_c$ which corresponds to the controllable non-dominant pole of the LDO regulator can be calculated as per Equation 3 above, substituting R with the resistance of the bias resistor 46 and C with the capacitance of the bias capacitor 48.

The current 64 generated by the bias control transistor 50 is summed with the minimal bias current that is generated by the tail transistor 36 to form a total bias current 66 that drives the differential amplifier within the error amplifier stage 4. As the load current 60 increases, so too does the current through the replica transistor 42, which due to the adaptive biasing stage 8 causes the bias current 66 supplied to the differential amplifier stage 4 to increase. This means that at low load currents, a smaller bias (or "quiescent") current 66 is supplied, but the LDO can handle larger load currents while remaining stable by scaling the bias current 66 accordingly.

Figure 2:
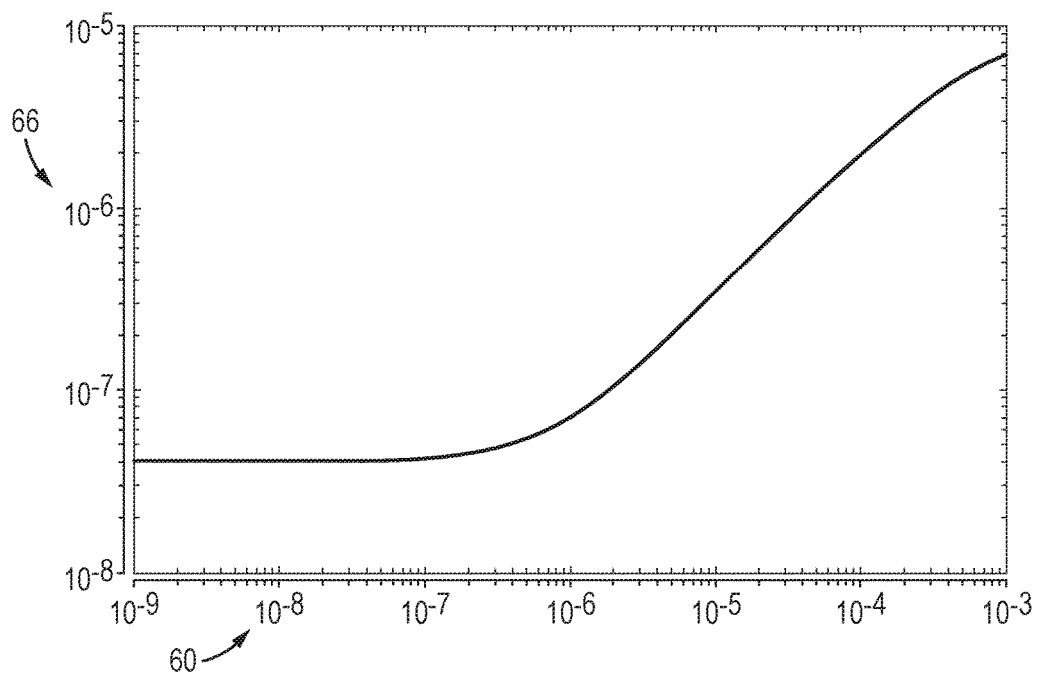
FIG. 2 is a graph showing the relationship between the bias current and the load current in the embodiment of FIG. 1.

FIG. 2 is a logarithmic graph showing the relationship between the load current 60 and the bias current 66 in amps for the embodiment of FIG. 1. As can be seen from the graph, for low load currents 60, a minimal bias current 66 is drawn by the LDO regulator 2. If the load current 60 is increased, the bias current 66 tracks such increases so as to maintain stability at all times.

Figure 3:
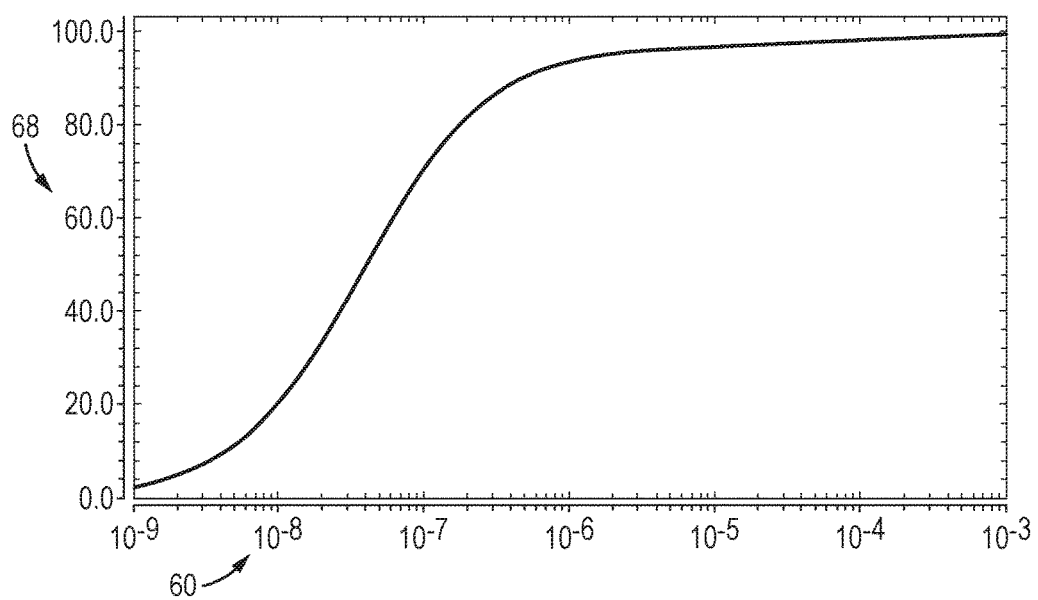
FIG. 3 is a graph showing the relationship between the current efficiency and the load current in the embodiment of FIG. 1.

FIG. 3 is a graph showing the relationship between load current 60 in amps (logarithmically) and the current efficiency 68 (linearly as a percentage) for the embodiment of FIG. 1.

The current efficiency 68 is calculated as the ratio between the load current 60 and the total current drawn from the power supply, as per Equation 4.

$$\text{Eff} = \frac{I_{load}}{I_{supply}} \qquad \text{Equation 4}$$

As can be seen from the graph, as the load current 60 increases, so too does the current efficiency 68. For load currents 60 above 500 nA, the current efficiency is greater than 90%.

Thus it will be seen that a low-dropout voltage regulator arrangement with improved power efficiency at low load currents capable of maintaining stability across a wide range of load currents has been described herein. Although a particular embodiment has been described in detail, it will be appreciated by those skilled in the art that many variations and modifications are possible using the principles of the invention set out herein.

The invention claimed is:

1. A voltage regulator comprising:
a differential amplifier portion including a first amplifier input connected to a reference voltage, a second amplifier input, and a differential output which is determined by a difference between said reference voltage and a voltage on the second amplifier input;
an output portion arranged to provide a regulator output voltage which is controlled by the differential output of the amplifier portion, said second amplifier input being connected to or derived from said regulator output voltage; and
a biasing portion arranged to measure an external load current and to provide a biasing current to the differential amplifier portion which depends on said load current, wherein the biasing portion comprises a biasing resistor and a biasing capacitor arranged to introduce a non-dominant pole that responds to the external load current such that said non-dominant pole is shifted to a higher frequency when the external load current is increased such that unity gain is reached before a second pole.

2. The voltage regulator as claimed in claim 1, wherein an output capacitor is connected in parallel with the output portion.

3. The voltage regulator as claimed in claim 2, wherein the output capacitor is provided externally of an integrated circuit device on which the voltage regulator is provided.

4. The voltage regulator as claimed in claim 1, wherein the biasing portion comprises a mirror transistor arranged to provide a mirror current.

5. The voltage regulator as claimed in claim 1, wherein the output portion comprises a first divider transistor having a first impedance and a second divider transistor having a second impedance arranged such that the regulator output voltage is a fraction of a supply voltage, said fraction being determined by a ratio of said first and second impedances, at least one of said first and second impedances being controlled by the differential output of the amplifier portion.

6. The voltage regulator as claimed in claim 5, wherein the biasing portion comprises a mirror transistor arranged to provide a mirror current and the mirror transistor is physically smaller than the first divider transistor.

7. The voltage regulator as claimed in claim 1, wherein the differential amplifier portion comprises a long-tailed pair arranged such that the gate terminal of a first differential transistor is connected to the first amplifier input and the gate terminal of a second differential transistor is connected to the second amplifier input, wherein the source terminals of the first and second differential transistors are connected to each other.

8. The voltage regulator as claimed in claim 7, wherein the source terminals of the first and second differential transistors are connected to a tail transistor.

9. The voltage regulator as claimed in claim 8, wherein the tail transistor is arranged as a current source.

10. The voltage regulator as claimed in claim 7, wherein the differential amplifier further comprises a first amplifier current mirror connected to the drain terminal of the first differential transistor and a second amplifier current mirror connected to the drain terminal of the second differential transistor.

11. The voltage regulator as claimed in claim 7, wherein the differential amplifier comprises a first amplifier current mirror connected to the drain terminal of the first differential transistor, wherein the first amplifier current mirror comprises:
a first transistor with its source terminal connected to the supply voltage, and its gate and drain terminals connected to the drain terminal of the first differential transistor; and
a second transistor with its source terminal connected to the supply voltage, and its gate terminal connected to both the drain terminal of the first differential transistor and the gate terminal of the first transistor.

12. The voltage regulator as claimed in claim 11, wherein the differential amplifier comprises a second amplifier current mirror connected to the drain terminal of the second differential transistor, wherein the second amplifier current mirror comprises:

a third transistor with its source terminal connected to the supply voltage, and its gate and drain terminals connected to the drain terminal of the second differential transistor; and a fourth transistor with its source terminal connected to the supply voltage, and its gate terminal connected to both the drain terminal of the second differential transistor and the gate terminal of the third transistor.

13. The voltage regulator as claimed in claim 12, wherein the differential amplifier comprises a third amplifier current mirror including:

a fifth transistor with its drain terminal connected to the drain terminal of the second transistor, and its source terminal connected to ground; and a sixth transistor with its drain terminal connected to the drain terminal of the fourth transistor, and its source terminal connected to ground, wherein the gate terminals of the fifth and sixth transistors are connected to one another.

14. The voltage regulator as claimed in claim 13, wherein the first, second, third, and fourth transistors are p-channel metal-oxide-semiconductor field-effect transistors and the fifth and sixth transistors are n-channel metal-oxide-semiconductor field-effect transistors.

15. The voltage regulator as claimed in claim 1, wherein the biasing portion comprises an adaptive biasing transistor arranged to provide a controllable biasing current to the differential amplifier portion.

16. The voltage regulator as claimed in claim 1, comprising a buffer portion.

17. The voltage regulator as claimed in claim 16, wherein the buffer portion comprises a buffer transistor arranged as a source follower.

* * * * *